United States Patent
Jaus et al.

(10) Patent No.: US 9,000,548 B2
(45) Date of Patent: Apr. 7, 2015

(54) REFLECTIVE SECONDARY LENS SYSTEM AND SEMICONDUCTOR ASSEMBLY AND ALSO METHOD FOR THE PRODUCTION THEREOF

(75) Inventors: Joachim Jaus, Freiburg (DE); Andreas Bett, Freiburg (DE); Michael Passig, Golbitz (DE); Gerhard Peharz, Gleisdorf (AT); Peter Nitz, Gundelfingen (DE); Wolfgang Graf, Eschbach (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 848 days.

(21) Appl. No.: 12/735,131

(22) PCT Filed: Dec. 22, 2008

(86) PCT No.: PCT/EP2008/011041
§ 371 (c)(1),
(2), (4) Date: Nov. 22, 2010

(87) PCT Pub. No.: WO2009/080354
PCT Pub. Date: Jul. 2, 2009

(65) Prior Publication Data
US 2011/0127546 A1    Jun. 2, 2011

(30) Foreign Application Priority Data
Dec. 20, 2007 (EP) .................................. 07024799

(51) Int. Cl.
*H01L 31/0232* (2014.01)
*H01L 31/054* (2014.01)
*H01L 33/60* (2010.01)

(52) U.S. Cl.
CPC .............. *H01L 31/0547* (2013.01); *H01L 33/60* (2013.01); *Y02E 10/52* (2013.01); *H01L 2924/0002* (2013.01); *H01L 31/054* (2013.01); *H01L 31/0543* (2013.01)

(58) Field of Classification Search
CPC ..................... H01L 31/054; H01L 2924/0002; H01L 33/60; Y02E 10/52
USPC ............................................ 257/81, 98, 432
See application file for complete search history.

(56) References Cited

U.S. PATENT DOCUMENTS

| | | | |
|---|---|---|---|
| 5,118,361 A | 6/1992 | Fraas et al. | |
| 5,167,724 A | 12/1992 | Chiang | |

(Continued)

FOREIGN PATENT DOCUMENTS

| | | |
|---|---|---|
| DE | 195 36 454 A1 | 4/1997 |
| DE | 199 47 044 B4 | 11/2006 |

(Continued)

OTHER PUBLICATIONS

V. Diaz et al, "Assembly of Concentrator Modules Based on Silicon Solar Cells at 300X of Concentrated Sunlight", Presented at the 19th European Photovoltaic Solar Energy Conference, 2004.

(Continued)

*Primary Examiner* — A. Sefer
(74) *Attorney, Agent, or Firm* — Marshall & Melhorn, LLC

(57) ABSTRACT

The present invention relates to a reflective and/or refractive secondary lens system for focusing sunlight onto semiconductor elements, the secondary lens system being characterized according to the invention by a projection which is disposed around the basic body forming the secondary lens system. Furthermore, the present invention relates to a semiconductor assembly which includes the secondary lens system according to the invention, and also to a method for the production of this semiconductor assembly. In particular, this semiconductor assembly represents a concentrating solar cell module.

60 Claims, 5 Drawing Sheets

(56) References Cited

U.S. PATENT DOCUMENTS

| | | | |
|---|---|---|---|
| 5,460,659 | A | 10/1995 | Krut |
| 5,505,789 | A | 4/1996 | Fraas et al. |
| 6,019,193 | A * | 2/2000 | Brown ............... 182/153 |
| 6,019,493 | A * | 2/2000 | Kuo et al. ............ 362/335 |
| 6,396,082 | B1 * | 5/2002 | Fukasawa et al. ....... 257/79 |
| 7,247,940 | B2 | 7/2007 | Hoefer et al. |
| 7,429,757 | B2 | 9/2008 | Oyama et al. |
| 2006/0098308 | A1 * | 5/2006 | Angelini et al. ....... 359/820 |
| 2006/0208269 | A1 * | 9/2006 | Kim et al. ............ 257/98 |
| 2006/0266408 | A1 | 11/2006 | Horne et al. |
| 2007/0089778 | A1 | 4/2007 | Horne et al. |
| 2007/0126020 | A1 * | 6/2007 | Lin et al. ............ 257/100 |
| 2008/0074862 | A1 * | 3/2008 | Chang ................ 362/29 |

FOREIGN PATENT DOCUMENTS

| | | |
|---|---|---|
| EP | 0 657 948 A2 | 6/1995 |
| ES | 2 232 299 A1 | 5/2005 |
| JP | 2005 175389 A | 6/2005 |
| JP | 2007 066826 A | 3/2007 |
| WO | WO 91/18419 A1 | 11/1991 |
| WO | WO 2004/077558 A1 | 9/2004 |
| WO | WO 2005/043627 A1 | 5/2005 |
| WO | WO 2006/130520 A2 | 12/2006 |
| WO | WO 2007/039892 * | 4/2007 |

OTHER PUBLICATIONS

J. Jaus et al., "Heat Sink Substrates for Automated Assembly of Concentrator Modules", Presented at the 21st European Photovoltaic Solar Energy Conference and Exhibition, Sep. 4-8, 2006; Dresden, Germany; pp. 2120-2123.

A.W. Bett et al, "FLATCON™-Modules: Technology and Characterisation", Presented at the 3rd World Conference on Photovoltaic Energy Conversion, 2003, pp. 634-637.

* cited by examiner

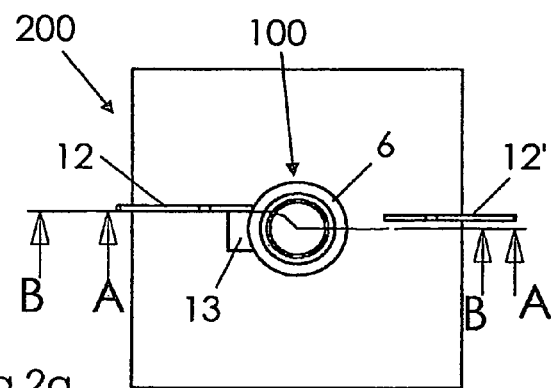
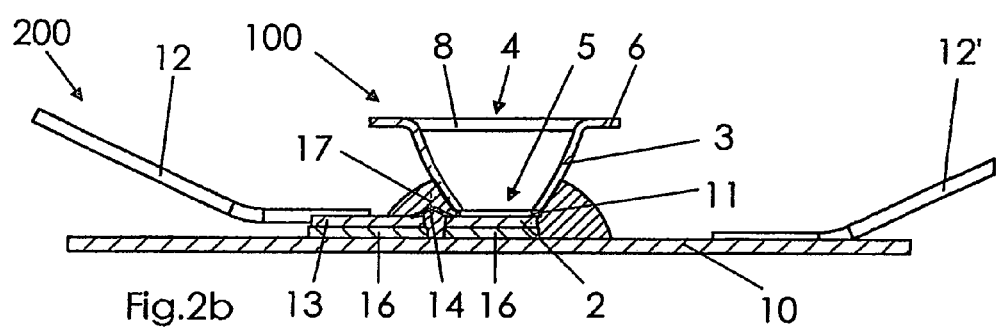
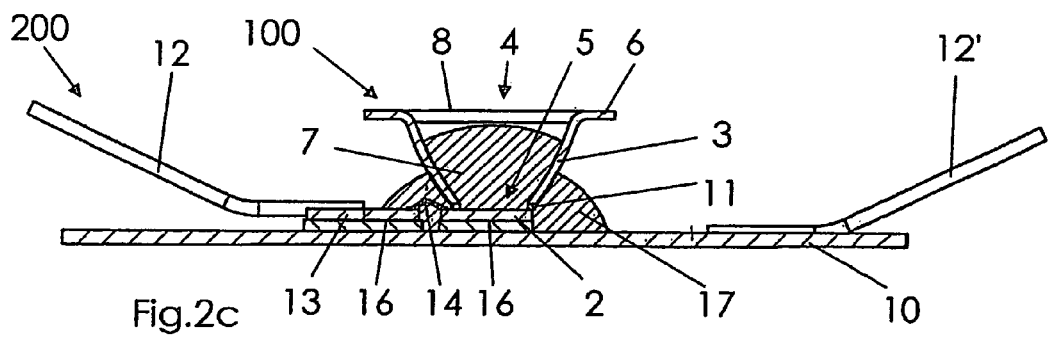

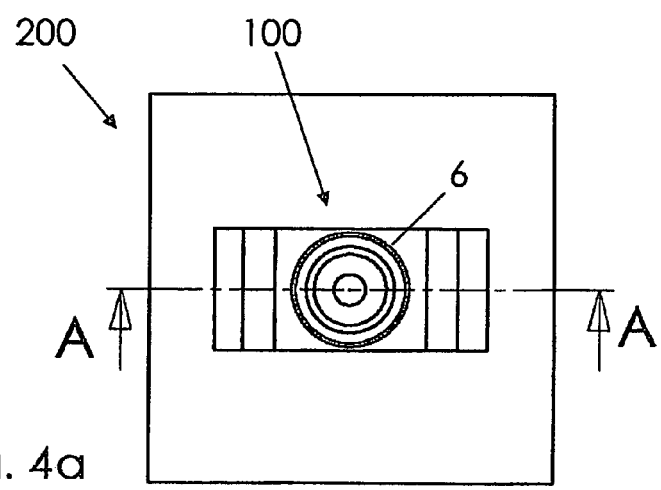
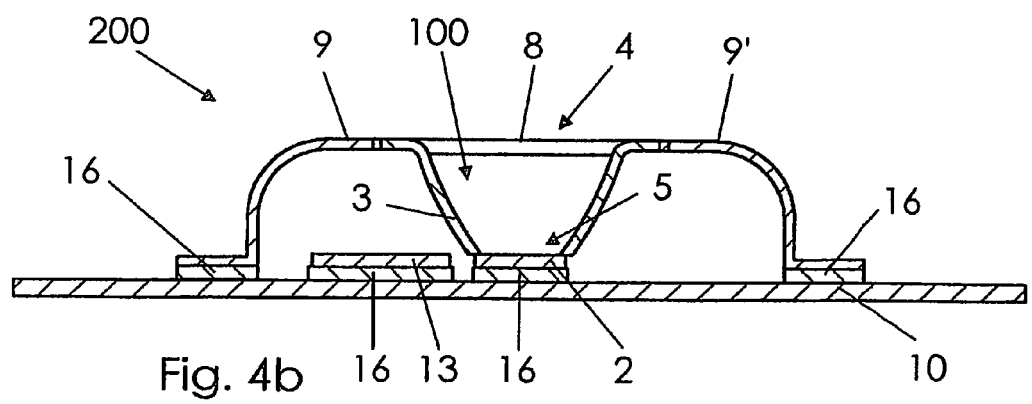
Fig. 4a
Fig. 4b

REFLECTIVE SECONDARY LENS SYSTEM AND SEMICONDUCTOR ASSEMBLY AND ALSO METHOD FOR THE PRODUCTION THEREOF

BACKGROUND OF THE INVENTION

The present invention relates to a reflective and/or refractive secondary lens system for focusing sunlight onto semiconductor elements, the secondary lens system being characterised according to the invention by a projection which is disposed around the basic body forming the secondary lens system. Furthermore, the present invention relates to a semiconductor assembly which includes the secondary lens system according to the invention, and also to a method for the production of this semiconductor assembly. In particular, this semiconductor assembly represents a concentrating solar cell module.

In concentrator photovoltaics, light is concentrated onto solar cells by means of an optical system. For this purpose, for example a lens or a Fresnel collector which bundle the incident light onto the solar cell is used. A plurality of solar cells is assembled with the associated optical system, e.g. a lens array, and also elements for cooling and for electrical wiring to form modules. These modules are mounted on so-called trackers on which they are made to track the course of the sun.

In concentrator photovoltaics, it is of great interest that as much as possible of the radiated light impinges on the solar cell. This is influenced, on the one hand, by the imaging quality of the optical system, on the other hand, by the accuracy with which the optical system is orientated towards the cell and also the module in total towards the sun.

A further important aspect in concentrator photovoltaics is the so-called concentration factor. This indicates the ratio of the light entrance surface of the lens system to the active surface of the solar cell. In order to use as little as possible of the relatively expensive solar cell surface, the concentration factor is chosen to be as large as possible. Precisely in the case of highly concentrating systems, the use of a two-stage lens system is possible, both elements of which are then termed primary lens system (first optical element in the beam path, e.g. the lens or the Fresnel collector) or secondary lens system (second element). A two-stage concept has the advantage that the beam deflection for each individual element can be smaller. In addition, the configuration clearance in the lens design is significantly increased, e.g. for reducing the chromatic aberration or for homogenising the incident radiation.

The secondary lens system has to date generally been configured as a refractive element in which the light beams are directed onto the solar cell by internal total reflection. Elements made of glass are known here in the form of a truncated pyramid (U.S. Pat. No. 5,505,789) or more complex forms which are based mainly on total reflection and are produced in the injection moulding process (e.g. ES 2232299; V. Diaz, J. Alarez, J. Alonso et al., "Assembly of Concentrator Modules based on Silicon Solar Cells at 300× of Concentrated Sunlight", Proc. of 19$^{th}$ European Photovoltaic Solar Energy Conference, 2004). In order to achieve as little reflection as possible on the exit surface, caused by great differences in the refractive index, this element is normally mounted directly on the solar cell via an adhesive and optically transparent material, e.g. silicone, and is provided possibly with a reflection-reducing coating on the entrance aperture.

At the same time, also simple secondary lens systems which are based on reflection on reflective surfaces are used. In the previously known applications, trapezoidal metallic bodies or round funnels are used (see e.g. EP 0 657 948 A2; WO 91/18419; L. M. Fraas, "Line-Focus Photovoltaic Module Using Stacked Tandem-Cells", 1994). In order to increase the refection of these components, the metal sheets are frequently provided with highly reflective layers before reshaping. Such constructions are known for example from U.S. Pat. No. 5,167,724 or U.S. Pat. No. 5,505,789 and reproduced by illustration in FIG. 1. The secondary lens system 50 is fitted thereby directly on the solar cell 2. Sunlight is thus prefocused onto the secondary lens system by the Fresnel collector 15.

Furthermore, components are known according to the state of the art (WO 2004/077558 A1; DE 195 36 454 A1; DE 199 47 044 B4), which are designed to be used in conjunction with semiconductor elements in which the radiation exits or is received entirely or partially on the lateral surfaces. This lateral radiation is characteristic of LED semiconductor chips. However, if semiconductor elements which emit or receive almost exclusively more than 95% of the radiation towards the upper side of the semiconductor chip, such as e.g. solar cells, are used, then part of the radiation is lost with the reflector concept according to these patents since the reflectors are designed such that the semiconductor chip is inserted from the top into the reflector recess and hence both lateral walls and upper contacting surface are in the beam course of the reflector. In the case of this construction, the reflecting regions enclose the entire semiconductor chip.

An element in which the transmitter and/or receiver is surrounded by a metallic reflector is known for example from DE 199 47 044 B4. The integral shaping of the reflector walls from the conductor strip material, known from this publication, is also based on the principle that the chip can be inserted into the reflector, i.e. the chip is smaller than the smallest reflector diameter/reflector cross-section.

A tub-shaped configuration of a reflector into which the semiconductor chip is inserted is likewise known from DE 195 36 454 A1.

An element in which a reflector is produced by metallisation of a housing body is known from WO 2004/077558 A1. Here also, the semiconductor chip is applied on a first region of the metallisation. If only a part of the chip surface is intended to be situated in the exit aperture of the reflector, this construction is not suitable.

This state of the art, with respect to the refractive secondary lens systems, has the following disadvantages:

Due to absorption in the material of the secondary lens system, part of the light is absorbed and therefore is no longer available for conversion in the solar cell.

Due to the absorption of the light in the material, the material heats too greatly so that, in particular in the case of highly concentrating systems, the result can be destruction of the secondary lens system.

At the entrance surface of the refractive lens system, the result is reflections due to the high refraction difference relative to the ambient air. These can in fact be reduced by antireflection coatings but these increase the manufacturing costs and can only reduce reflections but not prevent them.

The principle of total reflection (total internal reflection, TIR) places very high requirements on the surface quality of the components. This acts as a strong cost driver in production since the manufacturing methods favoured for large scale production, such as reshaping or injection moulding, and the surface qualities which can be achieved therewith frequently are inadequate. By means of grinding, the surface qualities can be achieved, however this is a relatively expensive process in high-volume manufacturing and is not compatible with the permissible costs in concentrator photovoltaics.

In order to avoid reflections, the space between cell and secondary lens system is filled, as described, with an optical medium (see e.g. ES 2232299, U.S. Pat. No. 5,505,789). In order to minimise air inclusions, this medium is normally applied in viscous state and hardened after assembly of the secondary lens system. Due to capillary effects or wetting effects, the result is however frequently wetting of the outside wall of the secondary lens system with the liquid medium, as a result of which the efficiency of the TIR is reduced. Because of the surface tension of the optical medium, the result in the region of the edges of the secondary lens system is formation of characteristic gaps which likewise lead to uncoupling of light and hence to reduction in efficiency.

Since the secondary lens system must, as a condition of the principle, cover the entire solar cell surface, all beams which are intended to be directed onto the solar cell must also previously pass through the secondary lens system. However, in the case of beams which would impinge on the cell even without this lens system, this leads to unnecessary losses. Precisely in the case of very good primary lens systems, a large part of the beams impinge on the cell even without a secondary lens system. In this case, a secondary lens system, which operates in addition to the primary lens system and detects merely the part of the beams which would not impinge on the cell without further intervention, is therefore optimal.

With respect to previous designs of reflective secondary lens systems, the following disadvantages should be mentioned:

The known secondary lens systems are difficult to mount since there are no elements which facilitate automatic engagement or simplify the mounting on the cell.

The mounting methods known from WO 91/18419, ES 2232299 or WO 2006/130520 A2 are based on using numerous additional mounting aids, such as e.g. screws, frames or clamping saddles. This drives up the material and process costs and increases the number of components susceptible to faults and hence the probability of the entire system failing.

With respect to the reflectors for semiconductor chips from (WO 2004/077558 A1; DE 195 36 454 A1; DE 199 47 044 B4), the main disadvantage is that the components described there are designed such that the semiconductor chip is placed in a reflecting shaped portion. As a result, only a relatively undefined beam course can however be produced, also the lateral walls or the surface metallisation, according to the incident/emergent beam angle, are situated in the beam course.

Since the reflection layers on the metal sheets tear in the reshaping process when the reshaping is too severe, the possibility of producing special geometries is greatly restricted.

Due to absorption in the material, the secondary lens systems can heat up greatly. To date, the use of special elements to increase the heat dissipation has only been documented in one application (WO 91/18419) in which the heat dissipation is however produced via an additional component which is complex to produce.

The reflective layers (e.g. silver-based layer systems) have high susceptibility to corrosion. In order to prevent this, the reflecting metal sheets are provided with a passivation layer. However, since the components are cut from ready coated metal sheet strips, the cut edges have material transitions which are open and on which the reflective layers are not passivated. These cut edges form the seed cells for corrosion during operation.

Further disadvantages can be found in the corresponding patent quotations in the documentation for the state of the art.

BRIEF SUMMARY OF THE INVENTION

The object underlying the invention is to develop an optoelectronic component, in particular a semiconductor element which emits or receives radiation such that the radiation to be emitted or received is directed onto the semiconductor chip and also the resulting heat is dissipated. The invention thereby relates to tasks in which there are used semiconductor chips which absorb/emit their radiation exclusively or by more than 90% via the surface lying in the wafer plane.

It is therefore the object of the present invention to provide a reflective and/or refractive secondary lens system which overcomes the above-mentioned disadvantages. Likewise, it is the object of the invention to provide a semiconductor assembly which contains this secondary lens system.

This object is achieved with respect to the secondary lens system with the features of claim 1 and, with respect to the semiconductor assembly, with the features of claim 23. In claim 38, a method for the production of the above-mentioned semiconductor assembly is indicated. The respective dependent claims thereby represent advantageous developments. The wording of the claims is jointly included by reference in the description.

Special application cases are application in a module for current generation from sunlight, preferably a module with a two-stage concentrator lens system, particularly preferred a module with a monolithic multiple solar cell, e.g. a triple solar cell, preferably with a solar cell comprising elements of main group III and V of the periodic table.

The function of the secondary lens system according to the invention is to direct the radiation impinging on the entrance aperture onto the solar cell situated at the exit aperture. In order to achieve this functionality, the secondary lens system should preferably have the following features and elements:

suitable shaping and surface design in order to maximise efficiency, elements for facilitating mounting in series production, elements for heat management, i.e. for improving convection and heat radiation, elements which increase the long term stability, elements which increase the reflection degree, elements for shading critical regions next to the solar cell.

The following requirements prevail on the production process for manufacturing this component:

low material and process costs, high manufacturing accuracy with respect to reflector shape, production of surfaces with low roughness, minimisation of burr and groove formation, application of layers which are as homogeneous as possible for increasing reflection with good optical properties and high adhesion force, application of protective layers which are as dense as possible with high transparency and good adhesion.

The subject of the invention thereby relates not only to the actual reflector component (secondary lens system) but the entire semiconductor component or assembly which includes the secondary lens system. In particular, the semiconductor component is thereby a so-called solar cell assembly, generally known as SCA. This SCA comprises typically the solar cell, the reflector, further elements and also the process for producing such an SCA.

A typical solar cell assembly according to the state of the art (e.g. U.S. Pat. No. 5,167,724; J. Jaus, U. Fleischfresser, G. Peharz et al., "Heat Sink Substrates for Automated Assembly of Concentrator Modules", Proc. of 21$^{st}$ European Photovoltaic Solar Energy Conference, 2006, pp. 2120-2123; A. W. Bett, C. Baur, F. Dimroth et al., "FLATCON™ modules; Technology and Characterisation", Proc. of 3$^{rd}$ World Conference on Photovoltaic Energy Conversion, 2003, pp. 634-637) consists of the solar cell, a substrate for heat conduction, e.g. copper, a plurality of applied metal layers for improving contactability, a solder- or adhesive layer for contacting the solar cell rear-side and also bonded or welded contactings of the solar cell upper side. In the following, the substrate for heat conduction is also frequently termed "chip carrier". This chip carrier is frequently designed as a conductor frame (lead frame).

By using a reflective and/or refractive secondary lens system according to the invention, a semiconductor assembly, in particular a solar cell module of the constructional type according to A. W. Bett, C. Baur, F. Dimroth et al., "FLATCON™ modules; Technology and Characterisation", Proc. of 3$^{rd}$ World Conference on Photovoltaic Energy Conversion, 2003, pp. 634-637, is substantially improved. Such a solar cell assembly with integrated secondary lens system thereby has the following advantages relative to the state of the art:
    good dissipation of the heat emanating from the solar cell,
    protection of the critical regions of the solar cell (e.g. edges of the actual layers, bond pads) from corrosion, thermal stress and/or damage by light radiation,
    resistance of all elements used to solar radiation which, because of the focusing, reaches a concentration by a multiple of up to 10,000.
    long term endurance of the entire construction,
    possibility of using economical starting materials,
    avoidance of and/or compensation for the thermal and/or mechanical stresses produced in operation.

The method according to the invention for the production of a semiconductor component, in particular a solar cell assembly with reflective secondary lens system, has the following advantages:
    low material and process costs,
    high positioning accuracy of the secondary lens system relative to the solar cell,
    avoidance of damage to solar cell, secondary lens system or other elements present on the solar cell assembly in the fitting process.
    compensation for unavoidable quality defects of the components used (e.g. burrs on the reflector underside), consequently increasing the overall efficiency in the manufacturing process.

BRIEF DESCRIPTION OF THE DRAWINGS

FIG. 2a is a plan view of an embodiment of an SCA comprising a secondary lens system according to the invention.
FIGS. 2b and 2c are sectional views along the lines A-A or B-B in FIG. 2a.
FIG. 3b is a sectional along line A-A of FIG. 3a.
FIG. 4a is a plan view of a further embodiment of an SCA comprising a secondary lens system according to the invention.
FIG. 4b is a sectional along line A-A of FIG. 4a.

DETAILED DESCRIPTION OF THE INVENTION

Figures 1A, 1B:
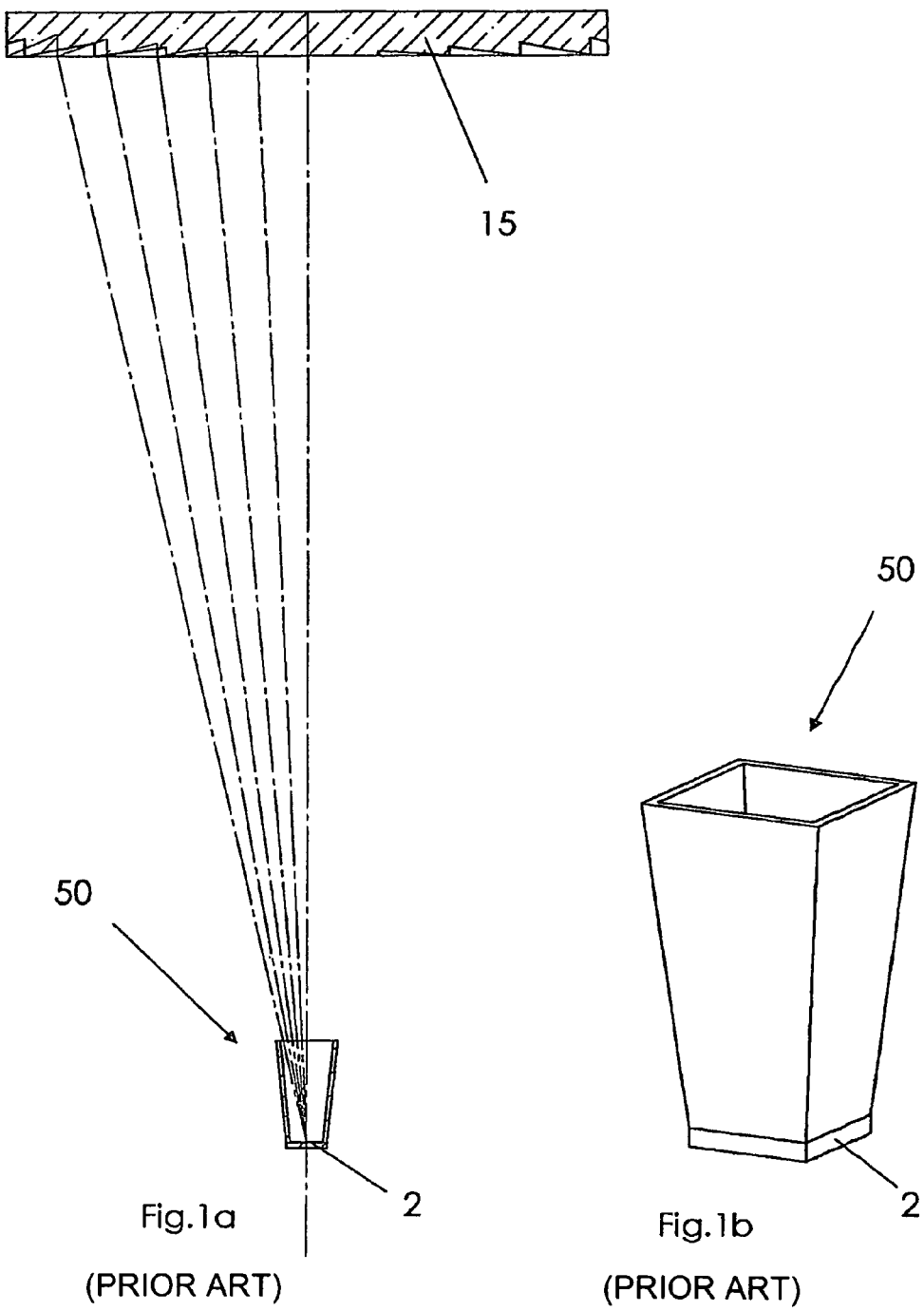
FIGS. 1a and 1b are views of a prior art secondary lens system.

The subject of the invention consists of a reflective and/or refractive secondary lens system and also a solar cell assembly with integrated reflective secondary lens system, which, due to their particular design and their special production processes, have great advantages relative to arrangements known from the state of the art.

For the assembly, a two-stage method is proposed, in which the actual connection couples the reflector mechanically, not frictionally to the cell, but directly to the chip carrier. In addition, an assembly method is proposed in which a secondary reflector is introduced according to the invention in a shaped portion of a previously fitted cover.

The produced improvements are represented subsequently in the sense of advantageous embodiments which should be understood as altogether optional.

Advantageous Embodiments

With Respect to the Secondary Lens System

The reflector consists of aluminium or an aluminium alloy. Particularly suitable are highly pure aluminium (>99% aluminium) and also aluminium alloys with >99% aluminium and added quantities <0.5% of magnesium. Further advantageous starting materials are stainless steel and brass.
The reflector outer side is provided with a layer which has a high radiation capacity for infrared radiation of wavelength >4000 nm.
In the case of reflectors made of aluminium or an aluminium alloy, this layer advantageously consists of a specifically applied aluminium oxide layer. Due to this layer, the temperature of the reflector can be lowered with all the advantages associated therewith.
The inside of the reflector is provided with a highly reflecting layer containing silver and also with protective layers which protect this highly reflective layer. Advantageously, aluminium oxide or silicon oxide are used.
The inside of the reflector is provided with a highly reflecting layer containing ultrapure aluminium (>99%) and also with protective layers which protect this highly reflective layer. Aluminium oxide or silicon oxide are used advantageously.
With Respect to the Ring of the Reflector (Projection):
The assembly, consists of solar cell, heat sink, contacting material, bonding wires, reflector and possibly also protective diode, terminal pad and thick wire bonding foot, is provided for example after the assembly of the reflector with an encapsulation material, e.g. an epoxy, silicone or carbonate plastic material. This encapsulation protects the mentioned elements from corrosion.
The reflector in the upper region has a projection which is configured as a ring. This ring prevents radiation from being able to impinge on the above-mentioned encapsulation material or the plastic materials used for assembly of the reflector. Due to the strong light intensity, the encapsulation material could consequently be destroyed. The subject of the invention relates therefore to a ring or another flat shaped portion which is at least so large that the filling compound situated thereunder cannot be impinged upon by the solar radiation.

This ring is furthermore advantageous for the assembly in which it serves as a grippable surface for the pick & place method. As a result, scratching of the usually sensitive reflector surface can be prevented. For this purpose, the ring is configured advantageously to be flat, advantageously parallel to the entrance aperture. By means of the preferred method for the production of the reflector shape, deep-drawing, this ring is produced without further complexity and with minimum use of materials.

The ring or another flat shaped portion at the upper end of the reflector causes a larger area distribution of the waste heat in the reflector. This waste heat is produced by absorption of the solar radiation impinging on the reflector or by the heat supplied to the reflector by heat conduction from the solar cell. As a result of the enlarged surface made available with the ring, the transport away of the heat by radiation or convection of the module interior air is improved. The module interior air is in turn discharged to the environment via the outer walls of the module.

With Respect to the Production Process of the Reflector:

Use of flat strip material of 50 μm to 1 mm thickness,

Shaping of the reflector shape by means of a stepped deep-drawing process in which, with a plurality of stamping and reshaping steps, the reflector shape, the ring and also possibly particular attachment elements can be formed directly out of the flat strip material.

A method in which the individual reflector elements are not yet completely separated after the shaping deep-drawing and reshaping processes, but still remain in the band strip via web-like connection elements. The thus produced semi-finished objects can be supplied readily for further process steps, such as e.g. a wet-chemical subsequent treatment for surface treatment of the reflector inside. As a result of the web-like connection elements, the individual reflectors remain still in defined form and position in the strip composite and thus can be further processed optimally. In particular, slipping of the individual components one into the other can consequently be prevented, as a result of which the inner surface would be damaged and surface-technical processes made difficult or impossible. In addition, the electrical contacting when using electrochemical process steps is made possible for the first time in the subsequent treatment due to the connection existing between all the reflectors in the strip material. Subsequent to the first shaping deep-drawing and reshaping process, the thus produced strip material with the shaped reflectors are subjected optionally to a wet-chemical processing. The process steps relate to cleaning (e.g. surfactant cleaning, acidic cleaning, alkaline cleaning), chemical or electrochemical polishing, chemical or electrochemical deburring, and also chemical or electrochemical application of an oxide layer.

This oxide layer protects the reflective inner surface from the influences of the ambient air.

Subsequently, separation of the reflectors from the strip is effected by a stamping process.

After the wet-chemical treatment of the reflectors, the application of further layers, e.g. silver- or aluminium-containing reflective layers, can be effected in order to increase the reflection degree further. In this case, subsequently also protective layers, e.g. aluminium oxide, silicon nitride or silicon dioxide are applied, e.g. by sputtering, chemical vapour phase deposition (CVD) or wet-chemically. In order to prevent exposed material transitions, the reflector can be detached from the composite by separating the webs before application of these protective layers. The reflectors then pass through the further processes in a suitable magazine device.

By means of the deep-drawing process, all optimised forms known from the literature can be produced, e.g. conical, parabolic, hyperparabolic or combined parabolic shapes. By means of the protective layers applied only after reshaping, no particular stress is applied any longer on these and the reshaping is influenced, within critical parameters, such as e.g. aspect ratio, still only by the drawing behaviour of the basic material.

With Respect to the Semiconductor Assembly with Reflector:

The semiconductor assembly is preferably an SCA.

The underside of the exit aperture of the reflector is connected by a first adhesive layer to the solar cell upper side. This adhesive film has however only very low cohesion and/or adhesion. In this way, upon a thermally caused expansion of the reflector, no force is transmitted to the solar cell upper side (danger of detachment of the contact metallisation of the solar cell). This first adhesive layer therefore represents a type of predetermined breaking point which is destroyed during operation upon the first expansion of the reflector.

In addition to this first connection layer, a second adhesive or filling compound is applied, which encloses a part of the chip carrier and also a part of the reflector. This second adhesive material produces a mechanically loadable, flat connection between the reflector and the chip carrier. The contact surface to the reflector outer wall is thereby significantly greater compared with the surface of the lower edge of the reflector. As a result, this second adhesive material can absorb the forces occurring during a thermal expansion significantly better. In addition, the heat produced in the reflector by absorption can be dissipated better to the chip carrier.

For this purpose, the second adhesive material can be improved by filling with thermally well-conducting materials, e.g. SiOH—, $SiO_2$ or $TiO_2$ particles, or ceramic particles, in their thermal conductivity.

This second filling compound can also enclose the edge of the solar cell and also the bonding wires. As a result, an encapsulation effect is achieved and hence these particularly critical regions are protected from weathering effects.

The materials used for the second filling compound, e.g. thermoplastic plastic materials, are generally not permanently resistant to strongly concentrated radiation. Therefore the projection (e.g. a ring or a similar flat shaped portion) on the upper side of the reflector is of essential importance in order to protect this filling compound from damage by impinging radiation during operation. In the case of a concentrator module, the entire focus beam can be directed onto the filling compound e.g. by faulty positioning of the tracker.

Alternatively to this construction, the reflector can also be coupled via an adhesive layer directly to the chip surface, e.g. surface of the solar cell. In order to avoid thermomechanical stresses, the adhesive layer is configured from a particularly flexible plastic material and/or is filled with particles with particularly good conductivity, e.g. silver or copper particles.

As a further alternative there is the possibility of using a mounting saddle, such as is known for example from WO 91/18419. The use of a saddle which has a central receiving opening for the actual reflector is known from this application. Preferably, such a mounting saddle can be shaped directly from the flat strip material in a single method step as a monolithic composite with the secondary lens system by means of the cold deep-drawing process, described above, from a flat metal strip. This integrated solution offers all the advantages of process simplification by omission of mounting steps and also a reduction in handling complexity by a reduction in the number of components required. The mounting saddle takes over the function of the shading projection or of the ring in this case.

Furthermore, an alternative method is proposed, in which the chip carrier has locking possibilities (e.g. clips) which protrude out of the chip carrier plane. The secondary lens system has suitable shaped portions which serve for attachment to the clips. The clips on the chip carrier have a guidance region which serves to widen the corresponding shaped portion on the secondary lens system. Furthermore, the locking possibilities have additionally or alternatively raised portions (e.g. a shaped mandrel or cup) in which a corresponding opening of the shaped portion of the secondary lens system can engage. The clip can also be shaped on the secondary lens system, the corresponding counter-receiving means is then shaped on the chip carrier. This embodiment enables a reliable, reversible fixing possibility of the secondary lens system in the total composite of the semiconductor component in which adhesives can be extensively dispensed with.

The solar cell, on its upper side, has a suitable layer in the region of the support surface of the reflector in order to prevent, during the mounting process, damage to the metallisation or to the semiconductor layers situated thereunder. This layer can be designed e.g. as an oxide layer, metal layer or as plastic material layer, such as polyimide or PTFE.

The secondary lens system can also be used for electrical connection to the solar cell upper side. For this purpose, the reflector has an enlarged shaped portion on the upper side which is connected electrically conductively next to the solar cell on a second electrical conductor region, the second electrical conductor region of the chip carrier which forms the first region being electrically insulated.

With Respect to the Mounting Method of the Solar Cell Assembly:

There are several advantageous mounting methods. In the case of the standard mounting method according to the invention, firstly a first adhesive material with low viscosity and with low cohesion and/or low adhesion and/or very high elasticity is applied by dispensing, inkjet methods, stamping or the like. Subsequently, the secondary lens system is removed by means of a gripper, e.g. vacuum gripper, from a suitable magazine device and is measured by a vision system from the underside. Taking into account the correction information of the vision system, the secondary lens system is placed on the previously applied first adhesive material. For this purpose, a maximum positioning force is defined via a spring tension or a defined spacing of 10 to 200 µm from the chip is maintained via spacers or a height sensor incorporated in the mounting head. As an alternative hereto, the application can also be effected on the reflector. If necessary, this first adhesive material can be hardened before the further process steps, this is not necessary with particularly low-viscous adhesive materials. Subsequently, the thus fixed secondary lens system is partially covered with a second adhesive material. The first adhesive material thereby prevents the second adhesive material from being able to move towards the active solar cell region as a result of capillary effects. Subsequently, the second material is hardened.

A further advantageous mounting method has the following sequence: the assembly, consisting of solar cell, heat sink, underside- and upper side contacting of the solar cell and also possibly also the protective diode with contactings and also possibly contact pads with contactings, is filled with a filling compound. The filling is effected in such a manner that parts of the assembly or even the entire assembly are enclosed in the filling compound. The filled region in the region of the solar cell has a recess which is adapted to the outer shape of the secondary lens system. The reflector can be inserted into this recess and fixed permanently by friction or in addition by added adhesive. This embodiment has the advantages that the solar cell can be protected from environmental influences by the encapsulation, that the resulting forces during heat expansion of the reflector are introduced over a large surface into the filling compound and also that the heat produced by the absorbed radiation can be dissipated readily via a large-area contact with the filling compound.

A further advantageous embodiment is the mounting of a reflector by means of a previously described mounting saddle. Likewise preferred is the use of an adhesive comprising well-conducting materials with particles made of silicon oxide, silicon hydroxide, silver or the like for the mounting of the saddle or mounting by means of direct joining (welding, soldering, bonding).

The reflector preferably has a spacing from the solar cell which, measured vertically from the underside aperture of the reflector up to the upper side grid of the solar cell, is 20 to 300 µm.

The reflector can be configured as a reflective element which comprises an optically transparent region with a higher refractive index than air, e.g. an epoxy, silicone or carbonate plastic material, and also a reflective layer surrounding the side region. Two essential advantages are consequently produced: firstly, as a result of the higher refractive index (relative to air) of the optically transparent region, an additional deflection of the beams impinging from the primary lens diagonally onto the surface of the transparent region results in the direction of the solar cell, secondly the solar cell surface is screened by the transparent region from environmental influences. The secondary lens system then has, in addition to the reflective properties, also refractive properties which are supplemented in an advantageous manner.

Such a component can be produced for example by filling a deep-drawn reflector with a transparent material, for example an epoxy, silicone or carbonate plastic material. An advantageous embodiment is the use of transparent materials with a high wetting angle (>90°) on aluminium oxide. In this case, preferably a convex lens-shaped surface is produced, which is amplified further by temperature effects during operation. By means of the convex surface, edge beams are advantageously broken and the number of reflections and hence the losses minimised. The convex shape of the surface is therefore advantageous for the angle acceptance of the concentrator module and also for further optical parameters (tilting tolerance, concentration increase).

The filling of the reflector with the optically transparent material can be effected before, during or after mounting on the solar cell. An advantageous embodiment is filling the reflector before applying onto the solar cell. For this purpose, the interior or a part of the interior of the reflector is filled with the transparent material approximately up to the exit aperture and this is hardened. The plane of the exit aperture is overlapped by the transparent region advantageously by 20 to 300 μm. As a result, an area of the size of the exit aperture or of the active region of the solar cell is produced. This area serves for mounting the secondary lens system directly on the solar cell by means of an optically transparent adhesive material.

A further advantageous mounting method is to apply a mobile, optically transparent material on the solar cell assembly before mounting in the region of the solar cell. The reflective secondary lens system is then inserted into this material and fixed by hardening of the material. The part of the filling compound situated in the interior of the secondary lens system thereby serves as protective layer for the active surface of the solar cell and also at the same time, by means of its higher density in comparison with air, as optical beam deflection. In order to amplify this effect, by further filling with transparent filling compound in the reflector, an increase in this effect can be achieved. At the same time, the part of the filling compound hardening outwith the reflector serves as protection for the cell edges and the connections to the surface contacting (bonding wires) from weathering effects.

The subject of the present invention is explained in more detail with reference to the Figures without restricting said subject to the parameters represented in particular in the Figures.

FIG. 2a shows a special embodiment of an SCA which comprises a secondary lens system according to the invention in plan view, whilst FIGS. 2b and 2c represent sections along the connection lines A-A or B-B indicated in FIG. 2a. FIGS. 2a, 2b and 2c thereby relate to a particular embodiment in which the secondary lens system 100 is integrated in the semiconductor component 200 which represents an SCA in the present case, a plurality of adhesive connections being provided for fixing the semiconductor component. All components of the SCA 200 are thereby applied on the chip carrier 10. The solar cell 2 and also the wiring pad 13, via which the current produced by the SCA 200 can be tapped via the contacts to the wiring 12 and 12', are thereby connected respectively to the chip carrier 10 by an adhesive or soldering 16. The current line from the solar cell 2 itself to the wiring pad 13 is thereby effected via a bonding wire 14. The secondary lens system 100 itself according to the invention thereby comprises the housing configured as reflector 3 which is configured essentially from a metallic basic material which has a particularly high reflection for light on the inside in the wavelength range of 350 to 2,000 nm. On the surface, a monolithically shaped projection 6 is configured which, on the one hand, can serve as mounting aid, and, on the other hand, protects at the same time critical regions of the solar cell assembly from the concentrated sunlight. This is evident above all from the view represented in FIG. 2a. In addition, the reflector 3 has a layer on the outside thereof which has a particularly favourable emission capacity in the wavelength range of 2,000 to 10,000 nm, e.g. a layer made of aluminium oxide. The chip carrier 10 thereby takes over the function of a cooling substrate, heat being able to be dissipated effectively by the large-area configuration of the chip carrier. An advantageous arrangement provides that the optical axis of the secondary lens system 100 extends as far as possible through the geometric centre of the active surface of the solar cell arrangement 200. The entrance aperture 4 of the secondary lens system 10 is thereby closed by a window 8 which is transparent in the relevant wavelength range. Fixing of the secondary lens system 100 to the solar cell 2 is thereby effected in the region of the exit aperture 5 by a first adhesive 11. Further securing of the secondary lens system 100 on the SCA 200 is ensured by an additional bonding material 17 which is applied around the secondary lens system. The bonding material 17 can thereby enclose some components of the SCA 200, such as for example the solar cell, the wiring pad 13 and the bonding wire 14. It is ensured by the projection 6 that at least the bonding material and also the parts of the SCA 200 situated thereunder are protected from the aggressive, concentrated, sun radiation. It is consequently ensured that the bonding material 17 is protected efficiently from ageing processes, such as for example embrittlement.

In FIG. 2c, an alternative embodiment of the SCA 200 represented in FIGS. 2a and 2b with a secondary lens system 100 is represented, the interior of the secondary lens system 100 being filled here almost entirely with an optically transparent filling material 7. In the case where this filling material 7 has a high refractive index, also a refractive concentration is effected additionally or alternatively to the reflective concentration of the sunlight within the secondary lens system 100. The surface of the filling material thereby preferably has a convex configuration.

Figure 3A:
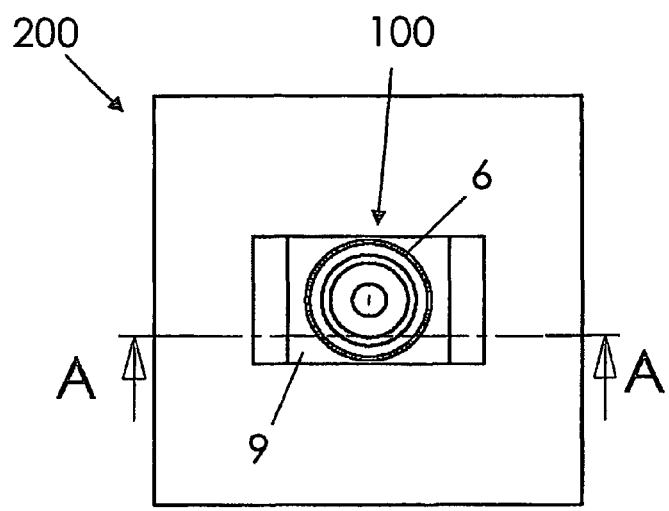
FIG. 3a is a plan view of a further embodiment of an SCA comprising a secondary lens system according to the invention.
Figure 3B:
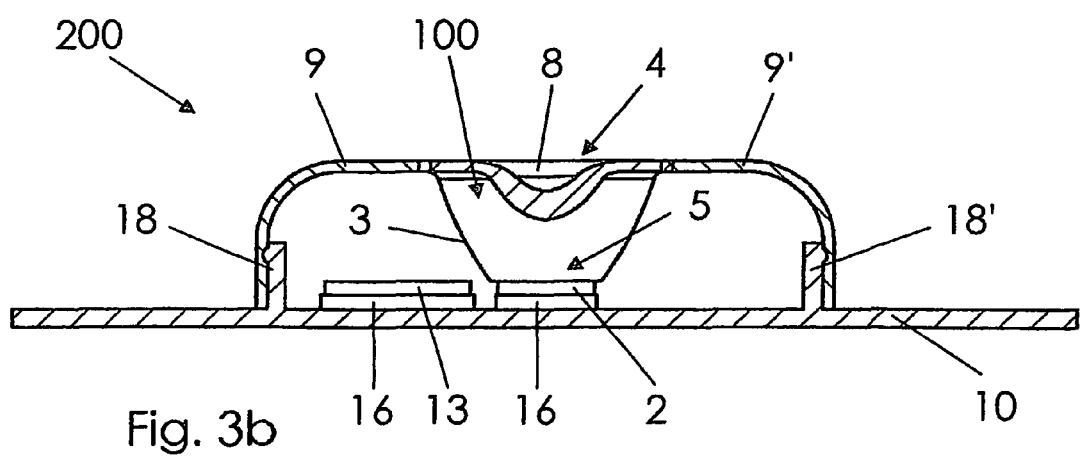

FIGS. 3a and 3b relate to a further advantageous embodiment of an arrangement 200 with secondary lens system 100, a few components of the SCA 200 (for example bonding wire 14) not being listed here solely for the sake of clarity. The embodiments of FIGS. 3a and 3b, FIG. 3a representing a perspective view of SCA 200, whilst FIG. 3b represents a section along the line A-A of FIG. 3a, relate essentially to an alternative fixing possibility for the secondary lens system 100 on the chip carrier 10. The chip carrier 10 hereby has the locking possibilities 18 or 18' which respectively have a groove which serves to fix the mechanical attachment elements 9 and 9' which are stamped respectively as saddles. The attachment elements 9 and 9' are thereby connected in a form-fit to the secondary lens system 100 and assume the function of the projection 6. Alternatively hereto, it is however also particularly preferred if the attachment elements 9, 9' are connected monolithically to the reflector 3; this is possible for example when producing the secondary lens system 100 by a deep-drawing method. The particular advantage of such an embodiment is that, due to simple mechanical means, permanent fixing of the secondary lens system 100 on the solar cell 2 can be produced whilst dispensing with an adhesive. Due to the large area of the saddles 9 and 9' which are preferably formed from metal, total screening of the components situated thereunder, such as for example the wiring pad 13 is ensured. Likewise good dissipation of thermal energy via the saddles 9 and 9' to the chip carrier 10 is made possible.

A further alternative embodiment of the mechanical fixing of the secondary lens system 100 on the chip carrier 10 is represented in FIGS. 4a and 4b, FIG. 4b, as already in the preceding Figures, representing a section along the lines A-A of FIG. 4a. The mechanical fixing of the saddle elements 9 and 9' is hereby effected by glueing 16 to the chip carrier 10. The further embodiments are identical to the features of FIGS. 3a and 3b.

Figure 5:
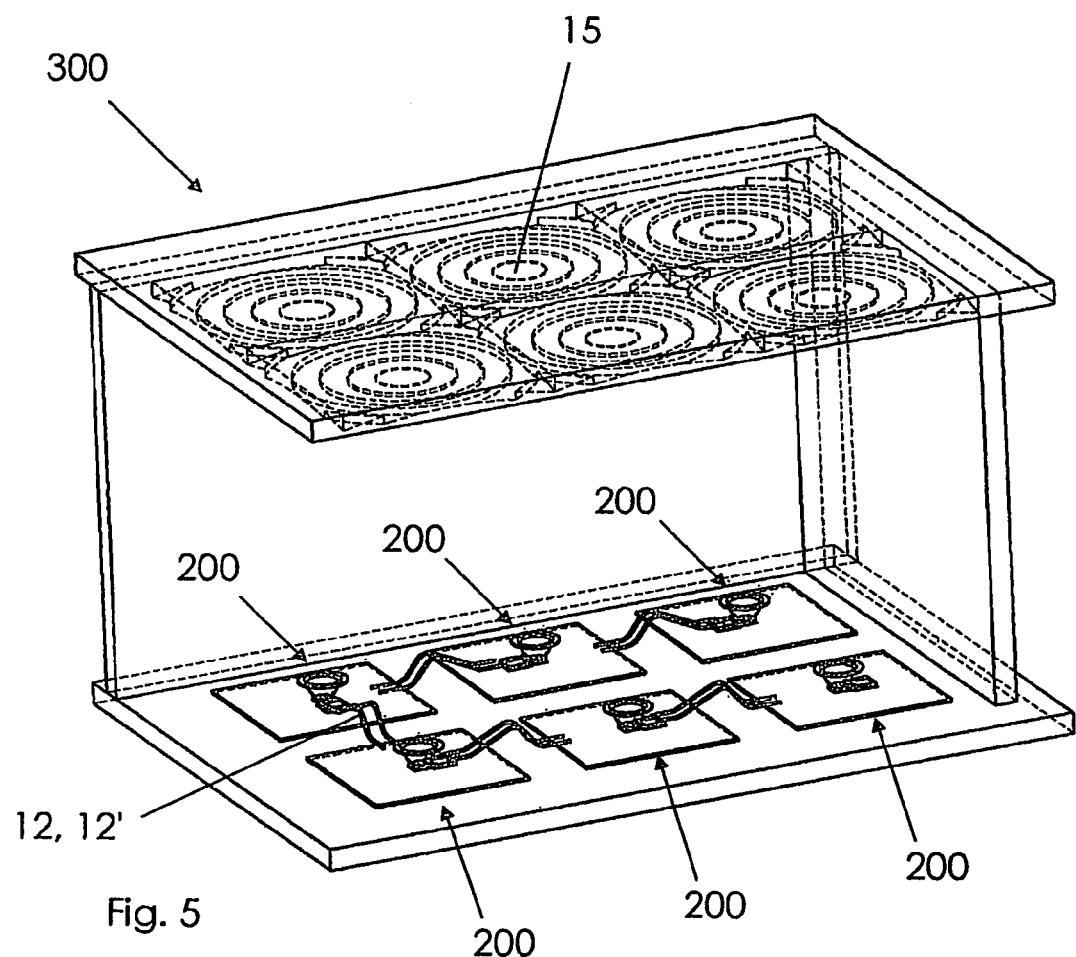
FIG. 5 is a perspective view of a module including a plurality of SCAs.

In FIG. 5, a module 300 is represented, which includes a plurality of SCAs 200 which are wired via the contacts 12 and

12'. Also shown is the arrangement of the concentrating primary lens system 15 which is configured in this case as a Fresnel collector.

In a preferred embodiment of the present invention, the projection (6) is disposed in the longitudinal direction of the reflector (3) at the level of the entrance aperture (4).

In a further preferred embodiment of the present invention, the projection (6) is connected to the reflector (3) monolithically or in a form-fit.

In a further preferred embodiment of the present invention, the projection (6) is disposed plane-parallel to the entrance aperture (4).

In a further preferred embodiment of the present invention, the projection (6) has an outline which is configured to be rectangular, square, circular, oval or of an irregular shape.

In a further preferred embodiment of the present invention, the reflector (3) comprises at least partially materials selected from the group consisting of aluminum or an alloy containing aluminum.

In a further preferred embodiment of the present invention, the reflector (3) has a wall thickness of 50 μm to 1 mm, preferably of 100 to 500 μm.

In a further preferred embodiment of the present invention, the reflector (3) and/or the surface of the projection (6) orientated towards the exit aperture (5) has at least one coating which has a total emission degree $\epsilon_n$ between 0.5 and 0.95 in the wavelength range of 2,000 to 10,000 nm.

In a further preferred embodiment of the present invention, at least one coating comprises aluminum oxide, preferably comprises aluminum oxide and/or comprises a varnish with a total emission degree $\epsilon_n$ between 0.5 and 0.95, preferably comprises this. In a further preferred embodiment of the present invention, the inside of the reflector (3) has at least one highly reflective coating with a reflection degree ρ>70% in a wavelength range of 400 to 800 nm and/or a reflection degree ρ>80% in a wavelength range of 900 to 2,500 nm.

In a further preferred embodiment of the present invention, the highly reflective coating comprises or consists of a metal, selected from the group comprising aluminum, preferably in highly pure (>99% by weight) form; silver, layer sequence of materials with different refractive indices $n^{20}_D$ and/or alloys or combinations hereof.

In a further preferred embodiment of the present invention, the inside of the reflector (3) has at least one protective coating which comprises or consists of aluminium oxide, silicon carbide and/or silicon oxide.

In a further preferred embodiment of the present invention, there is applied on the inside of the reflector (3), at least one highly reflective coating and, on the at least one highly reflective coating, at least one protective coating.

In a further preferred embodiment of the present invention, the cavity is filled at least partially with a material (7) which is optically transparent in the wavelength range of 300 to 2,500 nm.

In a further preferred embodiment of the present invention, the optically transparent material (7) has a higher refractive index $n^{20}_D$ than air.

In a further preferred embodiment of the present invention, the optically transparent material (7) in the liquid aggregate state has a wetting angle of more than 90° on aluminium oxide.

In a further preferred embodiment of the present invention, the optically transparent material (7) is selected from the group consisting of epoxy resin, silicone resin, polycarbonate, polyacrylates, glass, quartz glass and/or thermoplastic plastic materials.

In a further preferred embodiment of the present invention, the entrance- and/or the exit aperture (5) is closed with a window (8) which is optically transparent in the wavelength range of 300 to 2,500 nm.

In a further preferred embodiment of the present invention, the optically transparent window (8) is selected from the group consisting of glass, plexiglass, silicon oxide, silicon carbide and/or aluminum oxide.

In a further preferred embodiment of the present invention, there abuts against the projection (6) at least on one side an attachment element (9) which is moulded on in a form-fit and via which the secondary lens system can be connected to a semiconductor element and/or a chip carrier (10).

In a further preferred embodiment of the present invention, there abuts against at least two oppositely situated sides of the projection (6) respectively one attachment element (9).

In a further preferred embodiment of the present invention, the at least one attachment element (9) is molded monolithically on the projection (6).

In a further preferred embodiment of the present invention, the invention includes a secondary lens system and a light-absorbing and/or light-emitting semiconductor component (2), wherein the secondary lens system (100) is connected via the exit aperture (5) thereof in a form-fit to the light-absorbing and/or light-emitting semiconductor component (2).

In a further preferred embodiment of the present invention, the bond is produced by glueing (11) and/or mechanical fixing (9).

In a further preferred embodiment of the present invention, the adhesive (11) has low cohesion and/or adhesion.

In a further preferred embodiment of the present invention, the secondary lens system (100) of the light-absorbing and/or light-emitting semiconductor component (2) is disposed at a spacing of 1 to 5,000 μm, preferably of 5 to 1,000 μm, particularly preferred between 10 and 300 μm, at least that between the secondary lens system (100) and the light-absorbing and/or light-emitting semiconductor component (2) being filled with the adhesive (11).

In a further preferred embodiment of the present invention, there is included at least one further component, selected from the group consisting of contacts (12, 12') for electrical wiring of the semiconductor assembly to at least one further semiconductor assembly, a chip carrier (10), a wiring pad (13), a bonding wire (14) for electrical wiring of the light-absorbing and/or light-emitting semiconductor component (2) to the wiring pad (13), at least one protective diode and/or at least one primary lens system (15) for concentration of light onto the secondary lens system (100), such as e.g. a Fresnel collector, lens and/or mirror.

In a further preferred embodiment of the present invention, the light-absorbing and/or light-emitting semiconductor component (2) and/or the wiring pad (13) are fixed on the chip carrier (10), preferably by glueing (16).

In a further preferred embodiment of the present invention, the light-absorbing and/or light-emitting semiconductor component (2) and the secondary lens system (100) are fixed by a bonding material (17) on the chip carrier (10), the bonding material (17) enclosing at least partially at least the light-absorbing and/or light-emitting semiconductor component (2) and the secondary lens system (100).

In a further preferred embodiment of the present invention, the bonding material (17) is selected from the group consisting of thermoplastic plastic materials, epoxy resins, silicones, acrylates and/or cyanoacrylates.

In a further preferred embodiment of the present invention, the bonding material (17) comprises thermally conducting materials, such as e.g. metal chips or metal particles, preferably silver particles, copper particles and/or ceramic particles, silica gel and/or combinations hereof.

In a further preferred embodiment of the present invention, the bonding material (17) is covered completely by the projection (6) of the secondary lens system (100) in the projection direction towards the chip carrier (10).

In a further preferred embodiment of the present invention, the secondary lens system (100) is connected via the at least one attachment element (9) to the light-absorbing and/or light-emitting semiconductor component (2) and/or to the chip carrier (10).

In a further preferred embodiment of the present invention, the chip carrier (10) has at least one form-fitting, reversible locking mechanism (18) to which the at least one attachment element (9) can be connected.

In a further preferred embodiment of the present invention, the at least one light-absorbing and/or light-emitting semiconductor component (2) has, at least on the side connected to the secondary lens system (100), at least one protective coating, preferably selected from the group comprising a metal layer; oxide layer, in particular aluminum oxide and/or plastic material layer, such as e.g. polyimide and/or PTFE.

In a further preferred embodiment of the present invention, the secondary lens system (100) is contacted electrically with the at least one light-absorbing and/or light-emitting semiconductor component (2).

In a further preferred embodiment of the present invention, the semiconductor assembly is wired electrically in series and/or in parallel to at least one further semiconductor assembly via the at least one contact.

In a further preferred embodiment of the present invention, a secondary lens system is fixed on a light-absorbing and/or light-emitting semiconductor component (2) and/or on a chip carrier (10).

In a further preferred embodiment of the present invention, are the steps of: a) applying an adhesive (11) on the light-absorbing and/or light-emitting semiconductor component (2), b) pressing the secondary lens system (100) on the light-absorbing and/or light-emitting semiconductor component (2) so that a spacing of 1 to 5,000 µm, preferably of 5 to 1,000 µm, particularly preferred of 10 to 300 µm, is maintained between secondary lens system (100) and the light-absorbing and/or light-emitting semiconductor component (2), c) covering the composite produced in step a) and b) with a bonding material (17) which subsequently is hardened.

In a further preferred embodiment of the present invention, the application of the adhesive (11) is effected by means of inkjet methods and/or stamping processes. In a further preferred embodiment of the present invention, are the steps of: a) applying a bonding material (17) around the light-absorbing and/or light-emitting semiconductor component (2), whilst leaving a recess free, and b) inserting and fixing the secondary lens system (100) in the recess.

In a further preferred embodiment of the present invention, the filling compound is applied on the chip carrier (10) on which the light-absorbing and/or light-emitting semiconductor component (2) is disposed.

In a further preferred embodiment of the present invention, in addition the bonding wire (14), the wiring pad (13) and/or the at least one protective diode are enclosed at least partially by the filling compound.

In a further preferred embodiment of the present invention, fixing of the secondary lens system (100) is effected by adhesive friction and/or addition of further adhesive on the contact surfaces between the secondary lens system (100) and the recess of the filling compound.

In a further preferred embodiment of the present invention, the secondary lens system (100) is fixed on the chip carrier (10) at least by means of the at least one attachment element (9).

In a further preferred embodiment of the present invention, fixing is effected such that the at least one attachment element (9) is glued, screwed, riveted, welded, soldered and/or bonded to the chip carrier (10) and/or is fixed directly via locking possibilities (18), such as e.g. a shaped mandrel or a cup.

In a further preferred embodiment of the present invention, an adhesive (11) is applied on the light-absorbing and/or light-emitting semiconductor component (2), the secondary lens system (100) is pressed onto the place, coated with the adhesive (11), of the light-absorbing and/or light-emitting semiconductor component (2) and subsequently the adhesive is hardened.

The invention claimed is:

1. A reflective and/or refractive secondary lens system for focusing sunlight onto semiconductor elements, comprising a reflector having an entrance aperture orientated towards the sunlight and an exit aperture orientated towards the semiconductor component, the reflector having a projection surrounding the reflector, and wherein the reflector has an inner surface which has at least one protective coating which consists of or comprises aluminum oxide, silicon nitride or silicon oxide, and wherein the reflector has an outer surface, wherein the outer surface of the reflector and/or the surface of the projection orientated towards the exit aperture has at least one coating which has a total emission degree $\epsilon_n$ between 0.5 and 0.95 in the wavelength range of 2,000 to 10,000 nm.

2. The secondary lens system according to claim 1, wherein the projection is disposed in the longitudinal direction of the reflector at the level of the entrance aperture.

3. The secondary lens system according to claim 1, wherein the projection is connected to the reflector monolithically or in a form-fit.

4. The secondary lens system according to claim 1, wherein the projection is disposed plane-parallel to the entrance aperture.

5. The secondary lens system according to claim 1, wherein the projection has an outline which is configured to be rectangular, square, circular, oval or of an irregular shape.

6. The secondary lens system according to claim 1, wherein the reflector comprises at least partially materials selected from the group consisting of aluminum and an alloy containing aluminum.

7. The secondary lens system according to claim 1, wherein the reflector has a wall thickness of 50 µm to 1 mm.

8. The secondary lens system according to claim 7, wherein the reflector has a wall thickness of 100 to 500 µm.

9. The secondary lens system according to claim 1, wherein the at least one coating comprises aluminum oxide.

10. The secondary lens system according to claim 1, wherein the inner surface of the reflector has at least one highly reflective coating with a reflection degree $\rho > 70\%$ in a wavelength range of 400 to 800 nm and/or a reflection degree $\rho > 80\%$ in a wavelength range of 900 to 2,500 nm.

11. The secondary lens system according to claim 10, wherein the highly reflective coating comprises a metal, selected from the group comprising aluminum, silver, and/or alloys or combinations hereof.

12. The secondary lens system according to claim 10, wherein there is applied on the inner surface of the reflector, at least one highly reflective coating and, on the at least one highly reflective coating, at least one protective coating.

13. The secondary lens system according to claim 10, wherein the highly reflective coating comprises aluminum of >99% by weight form.

14. The secondary lens system according to claim 10, wherein the highly reflective coating comprises a metal layer sequence of materials with different refractive indices $n^{20}_D$.

15. The secondary lens system according to claim 1, comprising a cavity within the lens system, wherein the cavity is filled at least partially with a material which is optically transparent in the wavelength range of 300 to 2,500 nm.

16. The secondary lens system according to claim 15, wherein the optically transparent material has a higher refractive index $n^{20}_D$ than air.

17. The secondary lens system according to claim 15, wherein the optically transparent material in the liquid aggregate state has a wetting angle of more than 90° on aluminum oxide.

18. The secondary lens system according to claim 15, wherein the optically transparent material is selected from the group consisting of epoxy resin, silicone resin, polycarbonate, polyacrylates, glass, quartz glass and/or thermoplastic plastic materials.

19. The secondary lens system according to claim 1, wherein the entrance- and/or the exit aperture is closed with a window which is optically transparent in the wavelength range of 300 to 2,500 nm.

20. The secondary lens system according to claim 19, wherein the optically transparent window is selected from the group consisting of glass, plexiglass, silicon oxide, silicon carbide and/or aluminum oxide.

21. The secondary lens system according to claim 1, wherein there abuts against the projection at least on one side an attachment element which is moulded on in a form-fit and via which the secondary lens system can be connected to a semiconductor element and/or a chip carrier.

22. The secondary lens system according to claim 21, wherein the projection comprises first and second opposing sides, and on each of the first and second opposing sides is disposed an attachment element.

23. The secondary lens system according to claim 21, wherein the at least one attachment element is moulded monolithically on the projection.

24. A light-absorbing and/or light-emitting semiconductor assembly, comprising the secondary lens system according to claim 1, wherein the secondary lens system is connected via the exit aperture thereof in a form-fit to the light-absorbing and/or light-emitting semiconductor component.

25. The semiconductor assembly according to claim 24, wherein the secondary lens system is connected to the light absorbing and/or light emitting semiconductor component by glueing and/or mechanical fixing.

26. The semiconductor assembly according to the claim 25, wherein an adhesive is used to glue the secondary lens system to the light absorbing and/or light emitting semiconductor component, and the adhesive has low cohesion and/or adhesion.

27. The semiconductor assembly according to claim 26, wherein the secondary lens system of the light-absorbing and/or light-emitting semiconductor component is disposed at a spacing of 1 to 5,000 µm wherein the spacing between the secondary lens system and the light-absorbing and/or light-emitting semiconductor component being filled with the adhesive.

28. The semiconductor assembly according to claim 27, wherein the secondary lens system of the light-absorbing and/or light-emitting semiconductor component is disposed at a spacing of 5 to 1,000 µm.

29. The semiconductor assembly according to claim 28, wherein the secondary lens system of the light-absorbing and/or light-emitting semiconductor component is disposed at a spacing of between 10 and 300 µm.

30. The semiconductor assembly according to claim 24, further comprising at least one of:
    contacts for electrical wiring of the semiconductor assembly to at least one further semiconductor assembly,
    a chip carrier,
    a wiring pad,
    a bonding wire for electrical wiring of the light-absorbing and/or light-emitting semiconductor component to the wiring pad,
    at least one protective diode, and
    at least one primary lens system for concentration of light onto the secondary lens system.

31. The semiconductor assembly according to claim 30, wherein the light-absorbing and/or light-emitting semiconductor component and/or the wiring pad are fixed on the chip carrier.

32. The semiconductor assembly according to claim 30, wherein the light-absorbing and/or light-emitting semiconductor component and the secondary lens system are fixed by a bonding material on the chip carrier, the bonding material enclosing at least partially at least the light-absorbing and/or light-emitting semiconductor component and the secondary lens system.

33. The semiconductor assembly according to claim 30, wherein the light-absorbing and/or light-emitting semiconductor component and/or the wiring pad are glued on the chip carrier.

34. The semiconductor assembly according to claim 32, wherein the bonding material is selected from the group consisting of thermoplastic plastic materials, epoxy resins, silicones, acrylates and/or cyanoacrylates.

35. The semiconductor assembly according to claim 32, wherein the bonding material comprises thermally conducting materials.

36. The semiconductor assembly according to claim 35, wherein the thermally conducting materials comprise metal chips or metal particles and/or ceramic particles, silica gel and/or combinations thereof.

37. The semiconductor assembly according to claim 32, wherein the bonding material is covered completely by the projection of the secondary lens system in the projection direction towards the chip carrier.

38. The semiconductor assembly according to claim 36, wherein the thermally conducting materials comprise metal chips or metal particles, and the metal chips or metal particles are silver particles, copper particles or combinations thereof.

39. The semiconductor assembly according to claim 24, wherein the secondary lens system is connected via the at least one attachment element to the light-absorbing and/or light-emitting semiconductor component and/or to the chip carrier.

40. The semiconductor assembly according to claim 24, wherein the chip carrier has at least one form-fitting, reversible locking mechanism to which the at least one attachment element can be connected.

41. The method according to claim 40, wherein the locking possibilities comprise a shaped mandrel or a cup.

42. The semiconductor assembly according to claim 24, wherein the at least one light-absorbing and/or light-emitting semiconductor component has, at least on the side connected to the secondary lens system, at least one protective coating.

43. The semiconductor assembly according to claim 42, wherein the at least one protective coating is one of a metal layer, an oxide layer and/or plastic material layer.

44. The semiconductor assembly according to claim 42, wherein the at least one protective coating comprises aluminum oxide or polyimide and/or PTFE.

45. The semiconductor assembly according to claim 24, wherein the secondary lens system is contacted electrically with the at least one light-absorbing and/or light-emitting semiconductor component.

46. The semiconductor assembly according to claim 24, wherein the semiconductor assembly is wired electrically in series and/or in parallel to at least one further semiconductor assembly via at least one contact.

47. A method for the production of a semiconductor assembly according to claim 24, wherein the secondary lens system is fixed on a light-absorbing and/or light-emitting semiconductor component and/or on a chip carrier.

48. The method according to claim 47, comprising the following steps:
  a) applying an adhesive on the light-absorbing and/or light-emitting semiconductor component,
  b) pressing the secondary lens system on the light-absorbing and/or light-emitting semiconductor component so that a spacing of 1 to 5,000 μm, is maintained between secondary lens system and the light-absorbing and/or light-emitting semiconductor component to form a composite, and
  c) covering the composite produced in step a) and b) with a bonding material which subsequently is hardened.

49. The method according to claim 48, wherein the application of the adhesive is effected by means of inkjet methods and/or stamping processes.

50. The method according to claim 48, wherein in step b), a spacing of 5 to 1,000 μm is maintained between secondary lens system and the light-absorbing and/or light-emitting semiconductor.

51. The method according to claim 48, wherein in step b), a spacing of 10 to 300 μm is maintained between secondary lens system and the light-absorbing and/or light-emitting semiconductor.

52. The method according to claim 47, further comprising the following steps:
  a) applying a bonding material around the light-absorbing and/or light-emitting semiconductor component, whilst leaving a recess free,
  b) inserting and fixing the secondary lens system in the recess.

53. The method according to claim 52, wherein the bonding material is applied on the chip carrier on which the light-absorbing and/or light-emitting semiconductor component is disposed.

54. The method according to claim 52, wherein the fixing of the secondary lens system is effected by adhesive friction and/or addition of further adhesive on contact surfaces between the secondary lens system and the recess of the filling compound.

55. The method according to claim 47, wherein the secondary lens system is fixed on the chip carrier at least by means of at least one attachment element.

56. The method according to claim 55, wherein the fixing is effected such that the at least one attachment element is glued, screwed, riveted, welded, soldered and/or bonded to the chip carrier and/or is fixed directly via locking possibilities.

57. The method according to claim 53, wherein in addition a bonding wire, a wiring pad and/or at least one protective diode are enclosed at least partially by the filling compound.

58. The method according to claim 47, wherein an adhesive is applied on the light-absorbing and/or light-emitting semiconductor component, the secondary lens system is pressed onto the place, coated with the adhesive, of the light-absorbing and/or light-emitting semiconductor component and subsequently the adhesive is hardened.

59. The semiconductor assembly according to claim 24, wherein the at least one further component comprises a Fresnel collector, lens and/or mirror.

60. The secondary lens system according to claim 1, wherein the at least one coating comprises aluminum oxide and/or comprises a varnish with a total emission degree $\epsilon_n$ between 0.5 and 0.95.

\* \* \* \* \*